United States Patent
Lee et al.

(10) Patent No.: US 8,269,242 B2
(45) Date of Patent: Sep. 18, 2012

(54) SEMICONDUCTOR LIGHT EMITTING DEVICE HAVING SURFACE PLASMON LAYER

(75) Inventors: Dong Yul Lee, Gyunggi-do (KR); Seong Ju Park, Gwangju (KR); Min Ki Kwon, Jeollabuk-do (KR); Chu Young Cho, Gwangju (KR); Chang Hee Cho, Gwangju (KR); Yong Chun Kim, Gyunggi-do (KR); Seung Beom Seo, Gyunggi-do (KR); Myung Goo Cheong, Gyunggi-do (KR); Dong Joon Kim, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 11 days.

(21) Appl. No.: 12/628,467

(22) Filed: Dec. 1, 2009

(65) Prior Publication Data
US 2010/0181588 A1 Jul. 22, 2010

(30) Foreign Application Priority Data
Jan. 20, 2009 (KR) .................. 10-2009-0004547

(51) Int. Cl.
*H01L 33/00* (2010.01)
(52) U.S. Cl. ........... 257/98; 257/E33.067; 257/E33.069; 438/27
(58) Field of Classification Search ............ 257/98, 257/E33.067, E33.069; 438/27
See application file for complete search history.

(56) References Cited

U.S. PATENT DOCUMENTS

| 6,284,559 | B1 * | 9/2001 | Hata ................... 438/46 |
| 2003/0052328 | A1 | 3/2003 | Uemura |
| 2005/0285128 | A1 * | 12/2005 | Scherer et al. .......... 257/98 |
| 2007/0114523 | A1 * | 5/2007 | Oumi et al. ............ 257/40 |

FOREIGN PATENT DOCUMENTS

| JP | 2003-168823 | 6/2003 |
| KR | 10-2008-0055538 A | 6/2008 |

OTHER PUBLICATIONS

Japanese Office Action, and English translation thereof, issued in Japanese Patent Application No. 2009-275244 dated Jan. 10, 2012.
Min-Ki, K, et al. "Surface-Plasmon-Enhanced Light-Emitting Diodes", Advanced Materials, vol. 20, pp. 1253-1257. Mar. 7, 2008.
Yeh, D, et al. "Surface Plasmon Coupling Effect in an InGaN/GaN single-quantum-well light-emitting diode", Applied Physics Letters, vol. 91, 171103, Oct. 23, 2007.

* cited by examiner

*Primary Examiner* — Thao Le
*Assistant Examiner* — Matthew Gordon
(74) *Attorney, Agent, or Firm* — McDermott Will & Emery LLP

(57) ABSTRACT

Disclosed is a semiconductor light emitting device. The semiconductor light emitting device includes an n-type semiconductor layer, a p-type semiconductor layer, and an active layer disposed therebetween, and a surface plasmon layer disposed between the active layer and at least one of the n-type and p-type semiconductor layers, including metallic particles and an insulating material, and including a conductive via for electrical connection between the active layer and the at least one of the n-type and p-type semiconductor layers, wherein the metallic particles are enclosed by the insulating material to be insulated from the at least one of the n-type and p-type semiconductor layers. The semiconductor light emitting device can achieve enhanced emission efficiency by using surface plasmon resonance. Using the semiconductor light emitting device, the diffusion of a metal employed for surface plasmon resonance into the active layer can be minimized.

11 Claims, 4 Drawing Sheets

SEMICONDUCTOR LIGHT EMITTING DEVICE HAVING SURFACE PLASMON LAYER

CROSS-REFERENCE TO RELATED APPLICATIONS

This application claims the priority of Korean Patent Application No. 10-2009-0004547 filed on Jan. 20, 2009, in the Korean Intellectual Property Office, the disclosure of which is incorporated herein by reference.

BACKGROUND OF THE INVENTION

1. Field of the Invention

The present invention relates to a semiconductor light emitting device, and more particularly, to a semiconductor light emitting device capable of enhancing emission efficiency by using surface plasmon resonance.

2. Description of the Related Art

In general, nitride semiconductors are in wide use for green or blue light emitting diodes (LEDs) or laser diodes (LDs) serving as the light sources of full-color displays, image scanners, various signal systems and optical communications devices. Nitride semiconductor light emitting devices may include active layers that emit light of various colors including blue and green by the recombination of electrons and holes.

Since the development of nitride semiconductor light emitting devices, there have been a series of technical advancements to broaden their range of applications. In this light, various ongoing studies are seeking to determine how to effectively utilize nitride semiconductor devices in general lighting apparatuses and electrical lighting sources. According to the related art, nitride light emitting devices have been employed as components of low-current, low output mobile products. However, of late, the range of application of nitride light emitting devices have been broadened to the field of high-current, high-output products.

In response to the demand for LEDs in the field of high-current, high-output products, researches have been conducted to enhance emission characteristics. These researches have predominantly focused on the growth conditions of multiple quantum well structures (MQW) or the enhancement of the crystalline properties of quantum well layers and quantum barrier layers. However, the researches have limitations in enhancing internal quantum efficiency since they are chiefly associated with enhancing the emission efficiency by carriers confined in the energy band gap between the quantum barrier and quantum well layers.

SUMMARY OF THE INVENTION

An aspect of the present invention provides a semiconductor light emitting device, which has enhanced emission efficiency by using surface plasmon resonance.

According to an aspect of the present invention, there is provided a semiconductor light emitting device including: an n-type semiconductor layer, a p-type semiconductor layer, and an active layer disposed therebetween; and a surface plasmon layer disposed between the active layer and at least one of the n-type and p-type semiconductor layers, including metallic particles and an insulating material, and including a conductive via for electrical connection between the active layer and the at least one of the n-type and p-type semiconductor layers, wherein the metallic particles are enclosed by the insulating material to be insulated from the at least one of the n-type and p-type semiconductor layers.

Resonance may be caused by surface plasmons of the metallic particles and light emitted from the active layer. In this case, the metallic particles may be placed within the distance of 50 nm or less from the active layer.

The metallic particles may be enclosed by the insulating material to be insulated from both the n-type semiconductor layer and the p-type semiconductor layer.

The metallic particles may be a plurality of nanoscale particles.

The metallic particles may have the shape of a thin film.

The conductive via of the surface plasmon layer may be filled with a semiconductor material. In this case, the semiconductor material may be formed of the same material as that of the n-type semiconductor layer.

The surface plasmon layer may be provided in plurality. The surface plasmon layers may be disposed between the n-type semiconductor layer and the active layer and between the p-type semiconductor layer and the active layer, respectively.

The metallic particles may have a material selected from the group consisting of Ag, Al, Au, Pt and Cu.

The surface plasmon layer may have a thickness ranging from 0.1 nm to 500 nm.

The insulating material may be formed of silicon oxide or silicon nitride.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
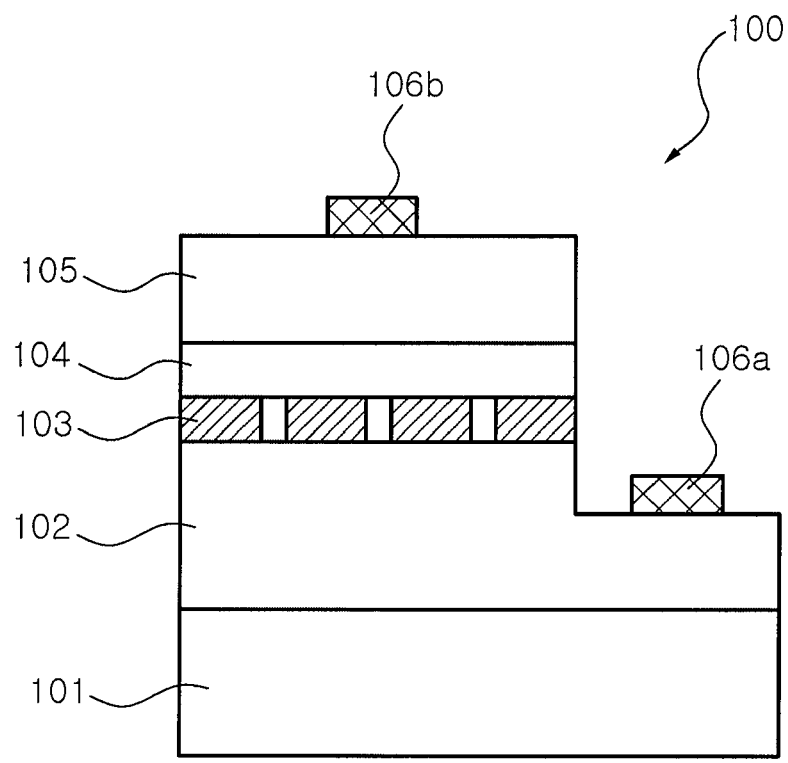
FIG. 1 is a cross-sectional view of a semiconductor light emitting device according to an exemplary embodiment of the present invention.

Exemplary embodiments of the present invention will now be described in detail with reference to the accompanying drawings.

The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 2:
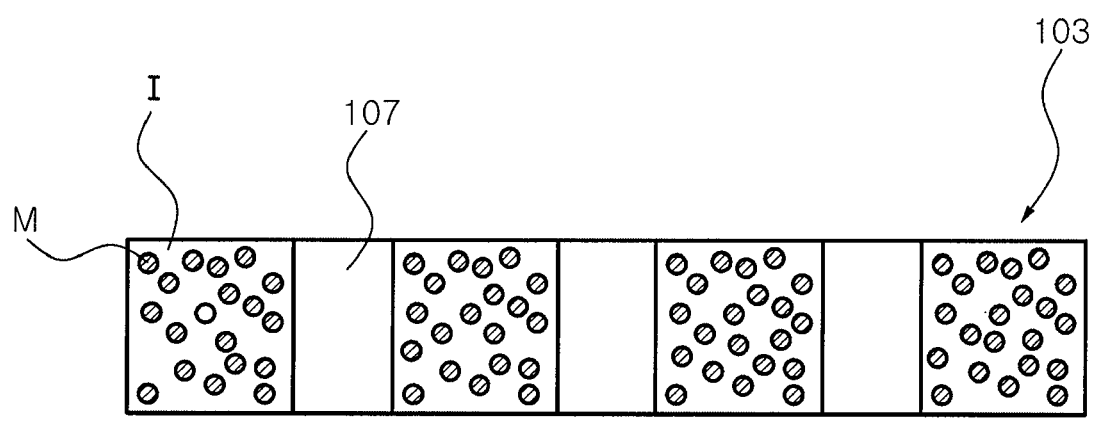
FIGS. 2 through 4 illustrate structures applicable to a surface plasmon layer depicted in FIG. 1.
Figure 3:
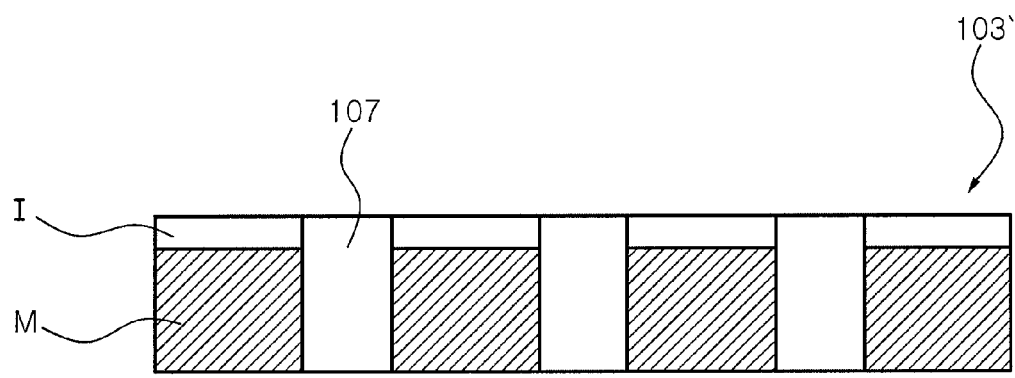
Figure 4:
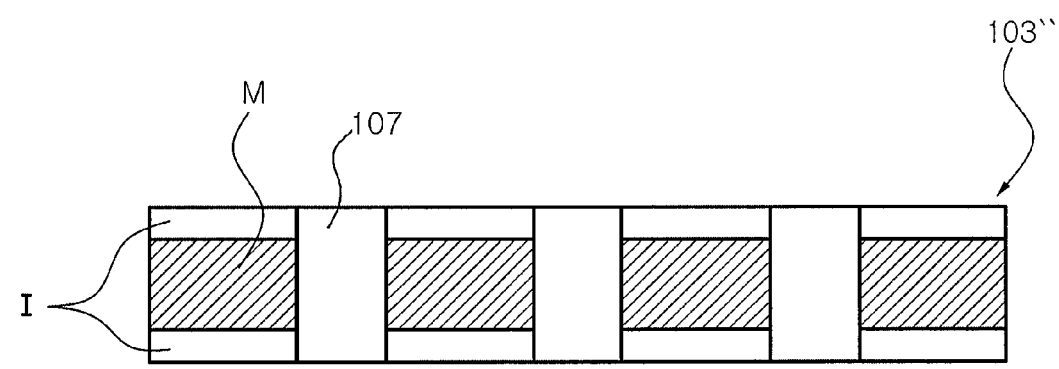

FIG. 1 is a cross-sectional view of a semiconductor light emitting device according to an exemplary embodiment of the present invention. FIGS. 2 through 4 illustrate structures applicable to a surface plasmon layer depicted in FIG. 1. Referring to FIG. 1, a semiconductor light emitting device 100, according to this embodiment, includes a substrate 101 for growing a single semiconductor crystal (hereinafter, referred to as 'single semiconductor crystal growth substrate'), an n-type semiconductor layer 102, a surface plasmon layer 103, an active layer 104, and a p-type semiconductor layer 105. An n-type electrode 106*a* and a p-type electrode 106*b* are disposed on the n-type semiconductor layer 102 and the p-type semiconductor layer 105, respectively.

The single semiconductor crystal growth substrate 101 may utilize a substrate formed of sapphire, Si, ZnO, GaAs, SiC, MgAl2O4, MgO, LiAlO2, LiGaO2, GaN or the like. The sapphire is a crystal body having Hexa-Rhombo (Hexa-Rhombo R3c) symmetry. The sapphire has a lattice constant of 13.001 Å in c-axis orientation, and a lattice constant of 4.758 Å in a-axis orientation; and has a C-plane (0001), an A-plane (1120) and an R-plane (1102). The C-plane of this sapphire substrate allows a nitride thin film to be grown thereupon relatively easily and is stable even at high temperatures, thus it is predominantly utilized as a substrate for nitride growth.

The n-type and p-type semiconductor layers 102 and 105 may be formed of nitride semiconductors, that is, n-doped and p-doped semiconductor materials having a composition represented by $Al_xIn_yGa_{(1-x-y)}N$ where $0 \leq x \leq 1$, $0 \leq y \leq 1$ and $0 \leq x+y \leq 1$, respectively. A representative example of the nitride semiconductor material includes GaN, AlGaN and InGaN. The n-type impurities may utilize Si, Ge, Se or Te, and the p-type impurities may utilize Mg, Zn or Be. The n-type and p-type semiconductor layers 102 and 105 may be grown by using a process known in the art, such as metal organic chemical vapor deposition (MOCVD) or hydride vapor phase epitaxy (HVPE).

The active layer 104, placed between the n-type and p-type semiconductor layers 102 and 105, emits light having a predetermined energy by the recombination of electrons and holes. The active layer 104 may be formed of a material such as $In_xGa_{1-x}N$ where $0 \leq x \leq 1$ so that a band gap energy can be controlled according to the In content. In this case, the active layer 104 may have a multiple quantum well (MQW) structure in which quantum barrier layers and quantum well layers are stacked alternately.

The surface plasmon layer 103 is disposed adjacent to the active layer 104, specifically, between the n-type semiconductor layer 102 and the active layer 104. However, as will be described later, the surface plasmon layer 103 may be disposed between the p-type semiconductor layer 105 and the active layer 104. Referring to FIG. 2, the surface plasmon layer 103 contains metallic particles M that can cause surface plasmon resonance by light emitted from the active layer 104. The metallic particles M may be nanoscale particles, and are enclosed by an insulating material I such as silicon oxide or silicon nitride.

The surface plasmon layer 103 includes a conductive via 107 because of the insulating material I interposed between the n-type semiconductor layer 102 and the active layer 104. Any electrically conductive material may be used for the conductive via 107. In particular, the conductive via 107 may be formed of the same material as the n-type semiconductor layer 102. In this case, the conductive via 107 may be formed by growing the n-type semiconductor layer 102 particularly in a lateral direction. This may contribute to enhancing the crystalline properties of the nitride semiconductor. In this embodiment, the insulating material I encloses the entirety of the metallic particles M on the nanoscale. However, each of the metallic particles M may be coated with the insulating material I such that the metallic particles M each act as a core.

The phenomenon of surface plasmon resonance, employed in this embodiment, will now be described briefly. First, surface plasmons are surface electromagnetic waves that propagate along the metal-dielectric interface. When light having a specific wavelength is emitted to the metal, resonance may occur, where most of light energy transfers to free electrons. This phenomenon is known as surface plasmon resonance (SPR). The conditions of causing SPR may include the wavelength of incident light, and the refractive index of a material contacting the metal, and crucially, the distance between a light emitting layer and a metal thin film. In detail, the metallic particles M, disposed within a distance of about 50 nm or less from the active layer 104, may be expected to enhance emission efficiency due to SPR. In this regard, the thickness (t) of the surface plasmon layer 103 may range from about 0.1 nm to about 500 nm.

The metallic particles M may chiefly utilize a metal, such as Au, Ag, Al, Pt and Cu, which has a negative (−) dielectric constant and emist electrons readily when external impact is applied. Of those metals, Ag, having the sharpest SPR peak, or Au, having high surface stability may be commonly selected. In addition, an alloy of those metals may be used as the material of the metallic particles M.

According to this embodiment, the metallic particles M for SPR are enclosed by the insulating material I, thereby preventing the metallic particles M from diffusing, particularly to the active layer 104 during the process of growing a single semiconductor crystal. Accordingly, emission efficiency can be enhanced significantly due to SPR, and the occurrence of defects and current leakage within the active layer 104 can be reduced, further enhancing the emission efficiency. If a metal layer is formed on the p-type semiconductor layer 105 to use SPR, a reduction in the thickness of the p-type semiconductor layer 105 may deteriorate electrical characteristics. However, according to this embodiment, the deterioration can be prevented since the surface plasmon layer 103 is formed adjacent to the active layer 104.

Unlike the embodiment depicted in FIG. 2, the metallic particles M may be provided in the form of a thin film, rather than as nanoparticles. As for a modified surface plasmon layer 103' depicted in FIG. 3, metallic particles M may be provided as a thin film by deposition or the like. The insulating material I is also provided as a thin film, covering the thin film of the metallic particles M. In the embodiment depicted in FIG. 3, the insulating material I is disposed only on the top of the thin film formed of the metallic particles M, in order to minimize the diffusion of the metallic particles M to the active layer 104. However, as in a surface plasmon layer 103'' depicted in FIG. 4, both the top and bottom of the thin film formed of the metallic particles M may be covered with the insulating material I so as to be insulated from the n-type and p-type semiconductor layers 102 and 105.

Figure 5:
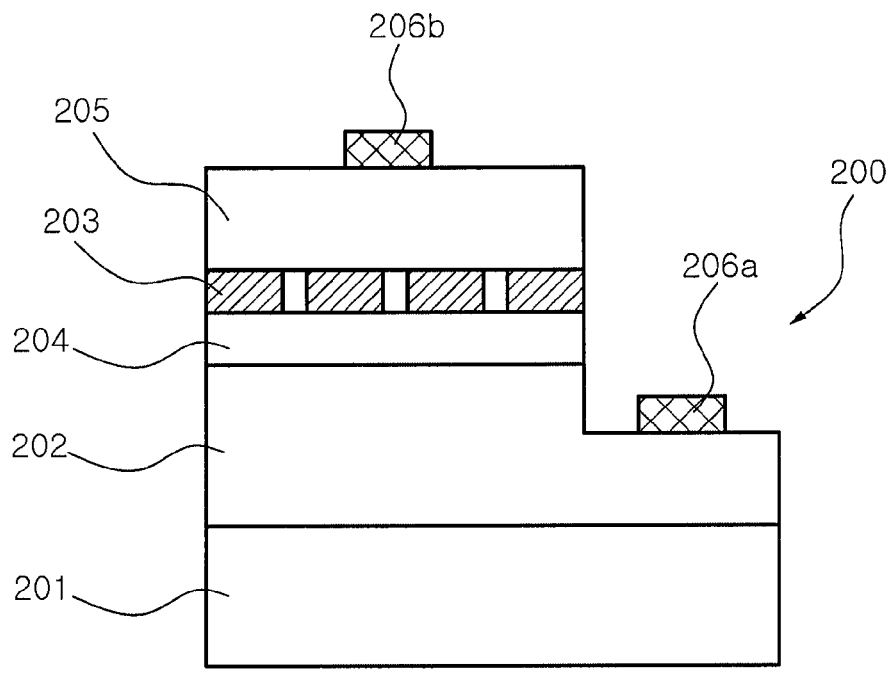
FIGS. 5 and 6 are cross-sectional views of semiconductor light emitting devices according other exemplary embodiments of the present invention, respectively.
Figure 6:
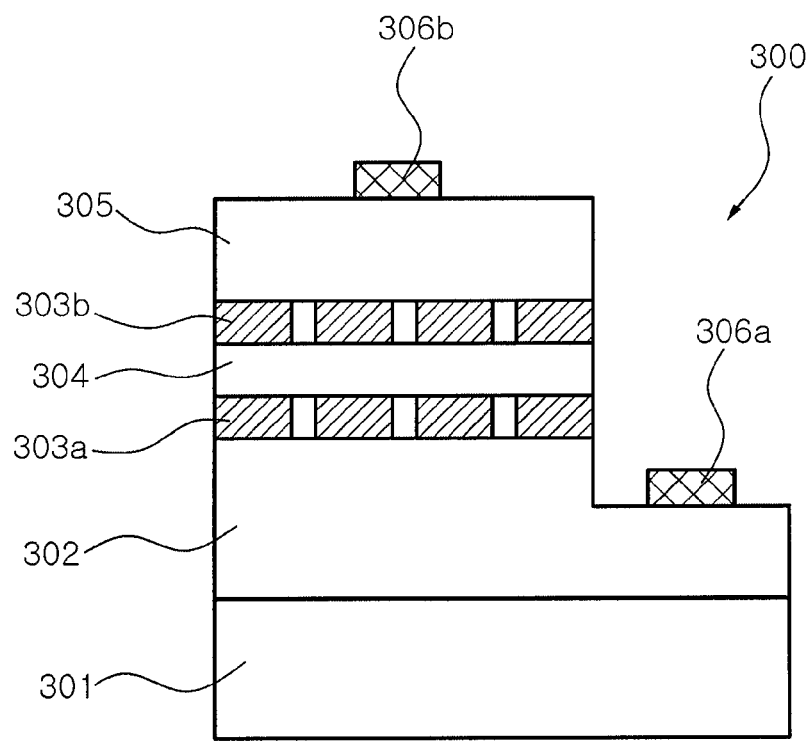

FIGS. 5 and 6 are cross-sectional views depicting semiconductor light emitting devices according to other exemplary embodiments of the present invention. Referring to FIG. 5, a semiconductor light emitting device 200, according to this embodiment, includes a single semiconductor crystal growth substrate 201, an n-type semiconductor layer 202, a surface plasmon layer 203, an active layer 204, and a p-type semiconductor layer 205. An n-type electrode 206*a* and a p-type electrode 206*b* are disposed on the n-type semiconductor layer 202 and the p-type semiconductor layer 205, respectively. The difference between this embodiment depicted in FIG. 5 and the embodiment depicted in FIG. 1 is that the surface plasmon layer 203 is disposed between the p-type semiconductor layer 205 and the active layer 204. A semiconductor light emitting device 300, according to an exemplary embodiment depicted in FIG. 6, includes a single semiconductor crystal growth substrate 301, an n-type semiconductor layer 302, surface plasmon layers 303a and 303b, an active layer 304 and a p-type semiconductor layer 305. An n-type electrode 306a and a p-type electrode 306b are disposed on the n-type semiconductor layer 302 and the p-type semiconductor layers 305, respectively. According to this embodiment depicted in FIG. 6, two surface plasmon layers 303a and 303b are employed adjacent to both the top and bottom of the active layer 304, respectively. This may further increase the effect of enhancing emission efficiency using SPR.

Figure 7:
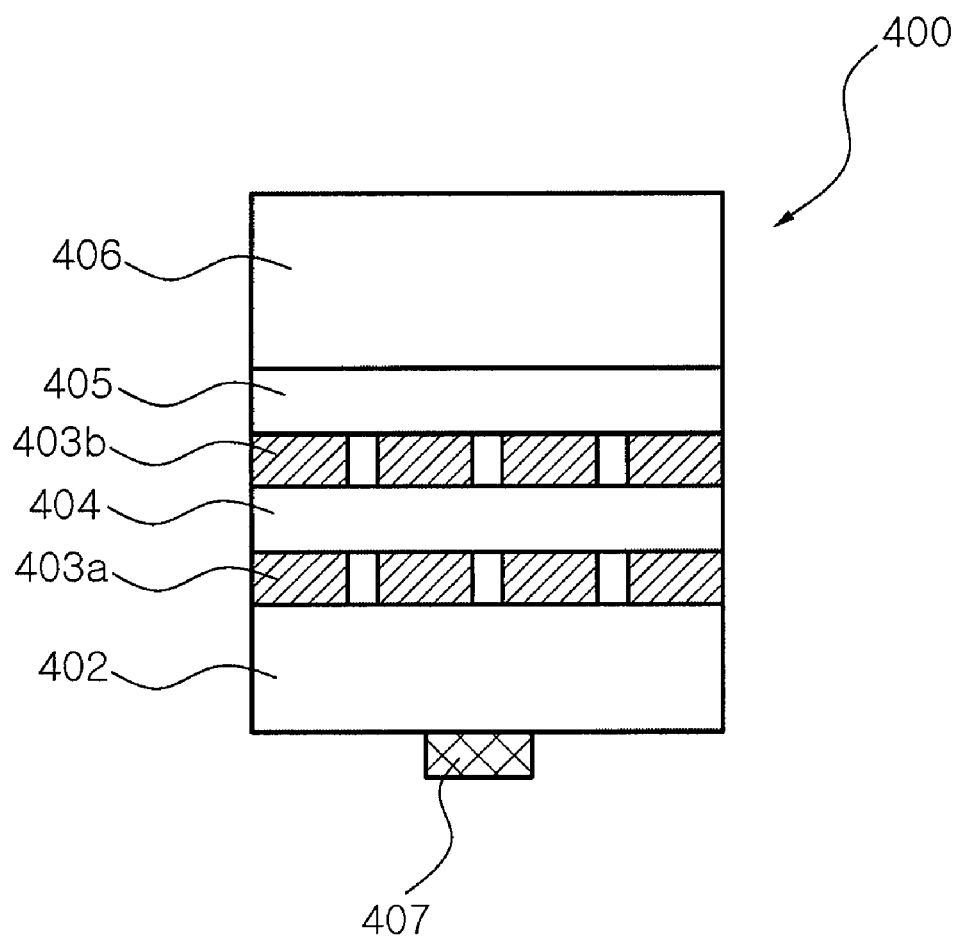
FIG. 7 is a cross-sectional view of a semiconductor light emitting device according to another exemplary embodiment of the present invention.

The above embodiments involve a horizontally structured semiconductor device in which n-type and p-type electrodes extend in the same direction. However, the present invention is not limited thereto, and is also applicable to a vertically structured semiconductor device. That is, as in an embodiment depicted in FIG. 7, a semiconductor light emitting device 400 has a vertical electrode structure where electrodes of opposite polarities are disposed in the direction of the lamination of layers. The semiconductor light emitting device 400 includes an n-type semiconductor layer 402, surface plasmon layers 403a and 403b, an active layer 404, a p-type semiconductor layer 405, and a conductive substrate 406. In this case, a single semiconductor crystal growth substrate is removed by laser lift-off or the like. After the removal process, an n-type electrode 407 is disposed on the exposed surface of the n-type semiconductor layer 402. Like terms may be understood as like elements to those of the previous embodiments, and thus a description will be made only of the conductive substrate 406.

The conductive substrate 406 serves as both a p-type electrode and a support that supports a light emitting structure, that is, the n-type semiconductor layer 402, the surface plasmon layers 403a and 403b, the active layer 404, and the p-type semiconductor layer 405 in the process such as laser lift-off. In this case, the conductive substrate 406 may utilize Si, Cu, Ni, Au, W or Ti, and be formed by plating, bonding or the like according to the selected material. Although not shown, a reflective metal layer serving for ohmic-contact and light reflection may be interposed between the p-type nitride semiconductor layer 405 and the conductive substrate 406.

As set forth above, according to exemplary embodiments of the invention, the semiconductor light emitting device can achieve enhanced emission efficiency by using SPR. Using the semiconductor light emitting device, the diffusion of a metal employed for SPR into the active layer can be minimized.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device, comprising:
an n-type semiconductor layer, a p-type semiconductor layer, and an active layer disposed therebetween; and
a surface plasmon layer disposed between the active layer and at least one of the n-type and p-type semiconductor layers, the surface plasmon layer including metallic particles and an insulating material, and including a conductive via for electrical connection between the active layer and the at least one of the n-type and p-type semiconductor layers, wherein the metallic particles are enclosed by the insulating material to be insulated from the at least one of the n-type and p-type semiconductor layers,
wherein the metallic particles are placed within a distance of 50 nm or less from the active layer.

2. The semiconductor light emitting device of claim 1, wherein resonance is caused by surface plasmons of the metallic particles and light emitted from the active layer.

3. The semiconductor light emitting device of claim 1, wherein the metallic particles are enclosed by the insulating material to be insulated from both the n-type semiconductor layer and the p-type semiconductor layer.

4. The semiconductor light emitting device of claim 1, wherein the metallic particles are a plurality of nanoscale particles.

5. The semiconductor light emitting device of claim 1, wherein the metallic particles have a shape of a thin film.

6. The semiconductor light emitting device of claim 1, wherein the conductive via of the surface plasmon layer is filled with a semiconductor material.

7. The semiconductor light emitting device of claim 6, wherein the semiconductor material is formed of the same material as that of the n-type semiconductor layer.

8. The semiconductor light emitting device of claim 1, wherein the surface plasmon layer is provided in plurality, wherein the surface plasmon layers are disposed between the n-type semiconductor layer and the active layer and between the p-type semiconductor layer and the active layer, respectively.

9. The semiconductor light emitting device of claim 1, wherein the metallic particles have a material selected from the group consisting of Ag, Al, Au, Pt and Cu.

10. The semiconductor light emitting device of claim 1, wherein the surface plasmon layer has a thickness ranging from 0.1 nm to 500 nm.

11. The semiconductor light emitting device of claim 1, wherein the insulating material is formed of silicon oxide or silicon nitride.

* * * * *